United States Patent
Baumann

(10) Patent No.: US 9,766,055 B2
(45) Date of Patent: Sep. 19, 2017

(54) METHOD AND DEVICE FOR SENSORLESS CONTROL OF A SEPARATELY EXCITED SYNCHRONOUS MACHINE

(71) Applicant: Continental Automotive GmbH, Hannover (DE)

(72) Inventor: Thomas Baumann, Regensburg (DE)

(73) Assignee: CONTINENTAL AUTOMOTIVE GMBH, Hannover (DE)

( * ) Notice: Subject to any disclaimer, the term of this patent is extended or adjusted under 35 U.S.C. 154(b) by 436 days.

(21) Appl. No.: 14/390,837

(22) PCT Filed: Mar. 27, 2013

(86) PCT No.: PCT/EP2013/056612
§ 371 (c)(1),
(2) Date: Oct. 6, 2014

(87) PCT Pub. No.: WO2013/149921
PCT Pub. Date: Oct. 10, 2013

(65) Prior Publication Data
US 2015/0061640 A1    Mar. 5, 2015

(30) Foreign Application Priority Data
Apr. 4, 2012    (DE) .......... 10 2012 205 540

(51) Int. Cl.
*G01B 7/30* (2006.01)
*H02P 6/18* (2016.01)
(Continued)

(52) U.S. Cl.
CPC .............. *G01B 7/30* (2013.01); *B60L 3/0061* (2013.01); *B60L 11/1803* (2013.01);
(Continued)

(58) Field of Classification Search
CPC ...................................................... G01B 7/30
(Continued)

(56) References Cited

U.S. PATENT DOCUMENTS 5,339,012 A    8/1994    Schroedl et al. ........ 318/400.04
5,796,235 A *  8/1998    Schrodl .................. H02P 6/185
                                              318/400.11
(Continued)

FOREIGN PATENT DOCUMENTS

DE    112004002619 T5    10/2006
DE    102006004034 A1    8/2007
(Continued)

OTHER PUBLICATIONS

Chinese Office Action, Application No. 201380029322.2, 13 pages, Jun. 2, 2016.
(Continued)

*Primary Examiner* — David S Luo
(74) *Attorney, Agent, or Firm* — Slayden Grubert Beard PLLC

(57) ABSTRACT

A method for sensorless control of a separately excited synchronous machine having a rotor includes the following steps: feeding a test signal on a parameter of an electrical current driving the rotor; measuring the parameter of the electrical current driving the rotor on an axis of the coordinate system describing the synchronous machine; determining an error signal by correlating the measured parameter of the electrical current driving the rotor with a temporally delayed test signal which is determined from the fed test signal; and adjusting a rotor angle as a reaction to the error signal if the error signal has a value not equal to zero.

15 Claims, 2 Drawing Sheets

(51) Int. Cl.
*B60L 3/00* (2006.01)
*B60L 11/18* (2006.01)
*B60L 15/20* (2006.01)
*G01B 7/004* (2006.01)
*G01R 23/02* (2006.01)
*H02P 23/26* (2016.01)
*H02P 25/024* (2016.01)
*H02P 25/03* (2016.01)

(52) U.S. Cl.
CPC .............. *B60L 15/20* (2013.01); *G01B 7/004* (2013.01); *G01R 23/02* (2013.01); *H02P 6/183* (2013.01); *H02P 23/26* (2016.02); *H02P 25/024* (2016.02); *H02P 25/03* (2016.02); *B60L 2220/14* (2013.01); *B60L 2240/423* (2013.01); *B60L 2250/10* (2013.01); *Y02T 10/644* (2013.01); *Y02T 10/645* (2013.01); *Y02T 10/7005* (2013.01); *Y02T 10/72* (2013.01); *Y02T 10/7275* (2013.01)

(58) Field of Classification Search
USPC .............................. 318/400.32, 400.01, 700
See application file for complete search history.

(56) References Cited

U.S. PATENT DOCUMENTS

| | | | |
|---|---|---|---|
| 7,462,999 B2* | 12/2008 | Mitchell | G01R 31/343 318/400.01 |
| 7,511,448 B2 | 3/2009 | Terada et al. | 308/807 |
| 7,948,721 B2* | 5/2011 | Brunner | H02P 29/032 318/503 |
| 2004/0257030 A1 | 12/2004 | Taguchi et al. | 318/808 |

FOREIGN PATENT DOCUMENTS

| | | |
|---|---|---|
| DE | 102009015106 A1 | 10/2010 |
| EP | 0539401 B1 | 4/1995 |
| EP | 1492224 A1 | 12/2004 |
| JP | 2008301695 A | 12/2008 |
| WO | 2007/085331 A1 | 8/2007 |
| WO | 2013/149921 A2 | 10/2013 |

OTHER PUBLICATIONS

International Search Report and Written Opinion, Application No. PCT/EP2013/056612, 17 pages, Apr. 16, 2014.

\* cited by examiner

METHOD AND DEVICE FOR SENSORLESS CONTROL OF A SEPARATELY EXCITED SYNCHRONOUS MACHINE

CROSS-REFERENCE TO RELATED APPLICATIONS

This application is a U.S. National Stage Application of International Application No. PCT/EP2013/056612 filed Mar. 27, 2013, which designates the United States of America, and claims priority to DE Application No. 10 2012 205 540.1 filed Apr. 4, 2012, the contents of which are hereby incorporated by reference in their entirety.

TECHNICAL FIELD

The invention relates to a method and a device for sensorless control of a separately excited synchronous machine, in particular a separately excited inverter-controlled synchronous machine, for example a synchronous machine in a vehicle.

BACKGROUND

A conventional synchronous machine has a rotor, which is excited with direct current, and a stator having a three-phase winding. Synchronous machines are used as a motor with a constant speed or else as phase shifters. They are also an important electrical machine for producing electrical energy. In this case, a distinction is made between permanently excited and separately excited synchronous machines which must be continuously supplied with an excitation current. This may be a direct current or a three-phase current depending on the type of excitation machine.

In order to control the phase currents in such a manner that a desired torque is produced with an efficiency which is as optimal as possible, exact information relating to the position of the rotor with respect to a stator winding is always required. In conventional synchronous machines, the rotational angle of the rotor is detected in this case using a sensor, for example using a resolver or a sine/cosine transducer.

However, such techniques increase the complexity of the overall system and reduce its reliability. The synchronous machine must therefore have a sensor which is installed in the rotor or is mechanically coupled to the latter, which results in increased costs and requires additional installation space for the sensor. The replacement of such a sensor is also associated with a considerable amount of effort. Furthermore, non-ideal sensor signals are intended to be compensated for and conceivable sensor errors are intended to be diagnosed as reliably as possible, on the other hand.

There is therefore the desire for sensorless detection of the position of the rotor of a synchronous machine, that is to say to replace the sensor with mathematical models, or by using physical effects.

The document EP 0 539 401 B1 discloses a method for controlling sensors of a synchronous machine, in which test signals are fed in and evaluated and which is based on the determination of an inductance which changes over the circumference of the rotor.

SUMMARY

One embodiment provides a method for sensorless control of a separately excited synchronous machine which has a rotor, the method comprising the following steps of: feeding a test signal into a characteristic variable of an electrical current driving the rotor; measuring the characteristic variable of the electrical current driving the rotor on an axis of a coordinate system describing the synchronous machine; determining an error signal by correlating the measured characteristic variable of the electrical current driving the rotor with a temporally delayed test signal which is determined from the test signal which has been fed in; and adapting a rotor angle in response to the error signal if the error signal has a value that is not equal to zero.

In a further embodiment, the test signal being a PRBS signal.

In a further embodiment, the coordinate system describing the synchronous machine being a dq coordinate system which is a coordinate system fixed with respect to the rotor.

In a further embodiment, the coordinate system describing the synchronous machine being an $\alpha\beta$ coordinate system which is a coordinate system fixed with respect to the stator.

In a further embodiment, the method comprises determination of the error signal by continuously multiplying and integrating the measured characteristic variable of the electrical current driving the rotor with the test signal which has been temporally delayed by the time.

In a further embodiment, the method comprises adaptation of the rotor angle on the basis of integration from a frequency.

In a further embodiment, the method comprises adaptation of the rotor angle on the basis of an arc tangent comprising an $\alpha$ component and a $\beta$ component of the measured characteristic variable of the electrical current driving the rotor.

Another embodiment provides a device for carrying out the method for sensorless control of a separately excited synchronous machine as disclosed above, wherein the device comprises a test signal generator for producing a test signal, a measuring unit for measuring the characteristic variable of the electrical current driving the rotor on an axis of a coordinate system describing the synchronous machine, a correlator for determining an error signal, and an observer for adapting a desired rotor angle in response to the error signal.

In a further embodiment, test signal generator is a signal generator for generating a PRBS signal.

Another embodiment provides a vehicle comprising a device as disclosed above.

BRIEF DESCRIPTION OF THE DRAWINGS

Example embodiments are explained below with reference to the drawings, in which.

DETAILED DESCRIPTION

Figure 1:
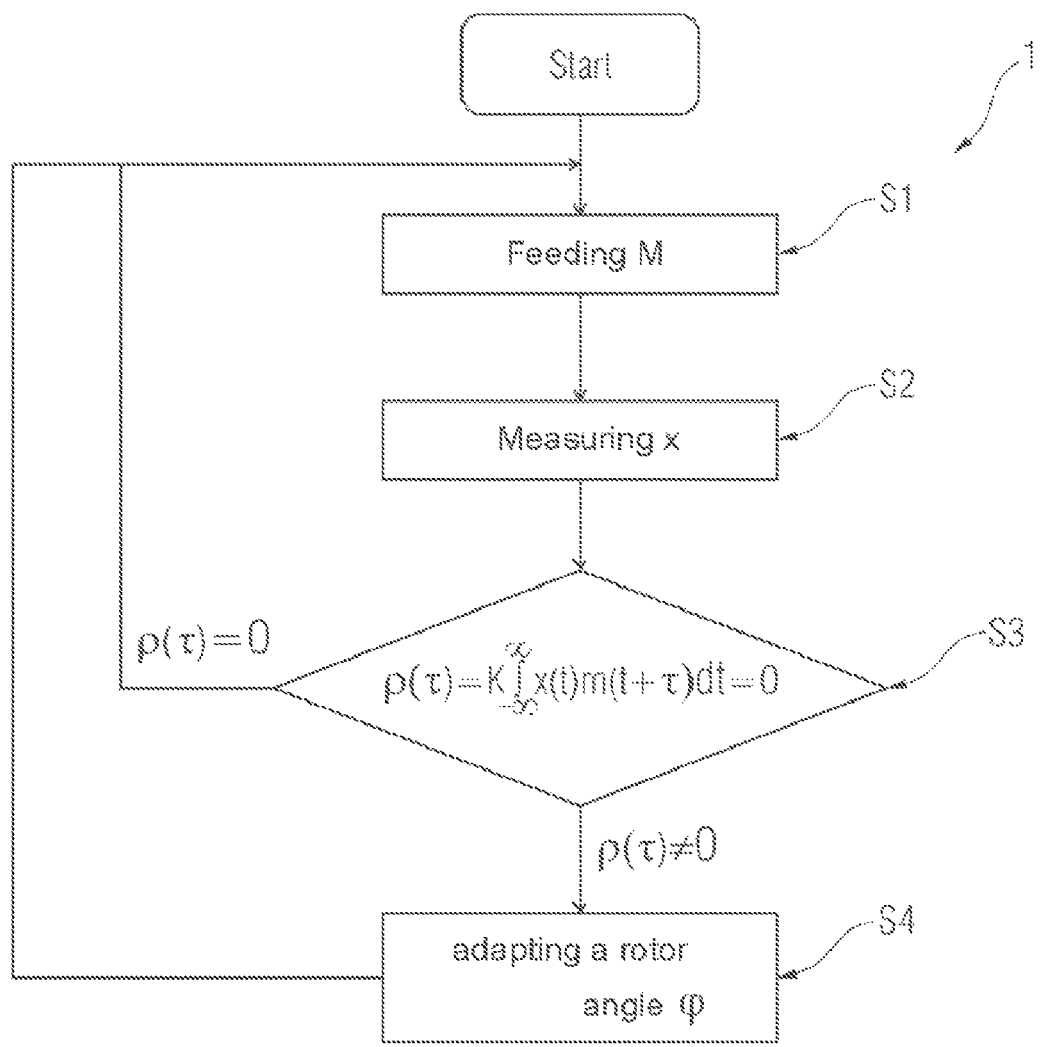
FIG. 1 shows a flowchart of a method for sensorless control of a separately excited synchronous machine according to one embodiment.

Embodiments of the present invention provide a method for controlling a separately excited synchronous machine, with the aid of which a required torque can be produced at any time with an optimal efficiency.

Some embodiments provide a method for sensorless control of a separately excited synchronous machine which has a rotor. In this case, the method has the following steps: a test signal is first of all fed into a characteristic variable of an electrical current driving the rotor. The characteristic variable of the electrical current driving the rotor is then measured on an axis of a coordinate system describing the synchronous machine.

An error signal is then determined, by means of correlation, from the measured characteristic variable of the electrical current driving the rotor and a temporally delayed test signal which is determined from the test signal which has been fed in, and a rotor angle is adapted in response thereto if the error signal has a value that is not equal to zero.

Thus the method includes the concept of determining a rotor position of a separately excited synchronous machine during controlled operation by evaluating a test signal and to adjust said position according to the operating conditions.

A method for sensorless control of a separately excited synchronous machine is therefore provided, with the aid of which a required torque can be produced with an optimal efficiency. The advantage is both that it is possible to dispense with a position sensor, thus saving costs and installation space, and there is a very high degree of accuracy when determining the desired rotational angle since the method is not subject to any motor parameters which may vary greatly as a result of temperature, saturation behavior and component control. An optimum torque can therefore be ensured even in the case of low speeds of the synchronous machine. Such methods can also be implemented without any additional hardware and with little software complexity since there is no need for any additional and complicated hardware components, for example for measuring an inductance. Since the method is not dependent on parameters, that is to say is not subject to any temperature dependence or component dependence, the method can also be combined with other, already known methods in order to correct one such other method, for example by adapting parameters or temperature.

In this case, the test signal may be a PRBS signal, that is to say a pseudo random bit stream. A PRBS signal is a binary signal which approximates the spectrum of white noise and is produced by a deterministic random generator. PRBS signals have the advantage that, on the one hand, they are simple to produce and, on the other hand, can be effectively distinguished from stochastic measured value noise or systematic interference, for example harmonics. The amplitude of the test signal can therefore be selected to be relatively small, as a result of which inaccuracies in an output, clocked phase voltage can be reduced and the accuracy of the method can therefore be increased further.

According to a first example embodiment, the coordinate system describing the synchronous machine is a dq coordinate system which is a coordinate system fixed with respect to the rotor. Differential equation systems of a synchronous machine simulation which describe a two-axis model of the magnetic-linear, electrically excited synchronous machine and take into account all electrical and magnetic variables of a stator, a rotor and a damper are usually represented in a dq coordinate system for the sake of simplicity. In this case, a space vector of measured machine currents is broken down into two components which result from projection in the direction of the flux space vector (d axis) produced by a rotor coil and perpendicular thereto (q axis). The desired torque and a stator flux of the machine can be set by controlling the two current components in this coordinate system fixed relative to the rotor position. The above-mentioned d axis of the coordinate system fixed with respect to the rotor is in this case the longitudinal axis direction which corresponds to a field pole direction. In synchronous machines, the above-mentioned q axis is still the transverse axis direction in a coordinate system fixed with respect to the rotor, which transverse axis direction is perpendicular to a field pole direction, that is to say perpendicular to a rotor axis.

According to a second example embodiment, the coordinate system describing the synchronous machine is an $\alpha\beta$ coordinate system. The $\alpha\beta$ coordinate system of a synchronous machine is oriented to the winding of the stator and is immovable. It is described by two components which are at right angles to one another and bear the Greek letters $\alpha$ and $\beta$. In the coordinate system fixed with respect to the stator of a synchronous machine, the vectors for current and voltage rotate and the $\alpha$ and $\beta$ components of the current and voltage vectors have sinusoidal profiles. The evaluation of the test signal in the coordinate system fixed with respect to the stator has the advantage that there is no need for a large amount of computational effort in order to transmit the electrical measurement variables of current and voltage into the coordinate system fixed with respect to the rotor, which results in lower software complexity.

The characteristic variable of the electrical current driving the rotor may be a current. In this case, the test signal can be fed into a d axis current component and a q axis current component of a dq coordinate system can be measured as excitation, the dq coordinate system preferably being oriented in such a manner that the d axis points to the rotor. The test signal can therefore be fed into a desired rotor current which corresponds to the d axis current component. The two signals are therefore superimposed without the desired rotor current being influenced by the test signal, thus making it possible to ensure an optimum torque with an efficiency which is as optimal as possible. Furthermore, the test signal can be fed into the q axis current component and a d axis current component can be measured as excitation, the dq coordinate system preferably being oriented in such a manner that the d axis points to the rotor. According to the second embodiment, the test signal can be fed into an $\alpha$ axis current component and a $\beta$ axis current component can be measured as excitation. According to a second variant of the second embodiment of the method, the test signal can also be fed into a $\beta$ axis of the $\alpha\beta$ coordinate system, that is to say into the $\beta$ axis current component, and the $\alpha$ axis current component can be measured as excitation.

Furthermore, the characteristic variable of the electrical current driving the rotor may also be a voltage. The test signal can therefore also be fed into a d axis voltage component and a q axis voltage component can be measured as excitation, the dq coordinate system preferably being oriented in such a manner that the d axis points to the rotor. The test signal can therefore be fed into a rotor voltage which corresponds to the d axis voltage component. The two signals are therefore superimposed without the rotor voltage being influenced by the test signal, thus making it possible to ensure an optimum torque with an efficiency which is as optimal as possible.

Furthermore, the test signal can also be fed into the q axis voltage component and the d axis voltage component can be measured as excitation, the dq coordinate system preferably being oriented in such a manner that the d axis points to the rotor. If the $\alpha\beta$ coordinate system is taken as a basis, the test signal can also be fed into an $\alpha$ axis voltage component and a $\beta$ axis voltage component can be measured as excitation. The test signal can also be fed into the $\beta$ axis voltage component and the $\alpha$ axis voltage component can be measured as excitation.

In this case, the step of determining an error signal may comprise continuously multiplying and integrating the measured characteristic variable with the temporally delayed test signal.

In this case, the rotor angle can be adapted, that is to say changed, if the determined error signal has a value which is not equal to zero. This is synonymous with measuring coupling of the test signal which has been fed into the characteristic variable of the electrical current driving the rotor to that axis of the coordinate system describing the synchronous machine on which it is measured.

If the integral has the value zero, the determined rotor position corresponds in this case to the desired rotor angle. In the event of angular deviations, that is to say if the integral has a value that is not equal to zero, correlation is detected, the sign of which indicates the direction of the desired correction. For example, if the test signal is fed into a d axis current component of a dq coordinate system of a synchronous machine, the integral is equal to zero if the d axis current component does not correlate to the test signal, and so the excitation is not coupled to the q axis. A high degree of accuracy of the system can therefore be ensured without the need for an increased amount of computational effort and therefore additional hardware components and/or increased software complexity.

According to the first example embodiment discussed above, the change in the rotor angle can be determined in this case on the basis of integration from a frequency. Since a coordinate system fixed with respect to the rotor, that is to say a co-rotating coordinate system, is used here when evaluating the test signal, the frequency can in turn be determined by integration from an acceleration.

According to the second example embodiment discussed above, the change in the rotor angle can also be determined by forming an arc tangent from an α component and a β component of the measured characteristic variable of the electrical current driving the rotor.

Overall, the rotor angle can therefore be adapted without a large amount of computational effort, with the result that a high degree of accuracy of the method is established without the need for additional hardware or increased software complexity in this case. In this case, the state variables, that is to say the frequency or angular frequency, can be corrected as soon as an angular deviation has been detected by means of correlation. An optimal angle profile can therefore be ensured, that is to say a desired torque can be produced with an efficiency of the synchronous machine which is as optimal as possible.

Other embodiments provide a device for carrying out an above-described method for sensorless control of a separately excited synchronous machine. In this case, the device comprises a test signal generator for producing a test signal, a correlator for producing an error signal and an observer for setting a desired rotor angle in response to the error signal.

Such a device has the advantage that the disclosed methods can be implemented without any problems in common control concepts without the need for any additional hardware components in this case or without resulting in increased software complexity. Furthermore, the test signal generator, the correlator and the observer are simple, conventional components of circuit arrangements, with the result that the disclosed methods can be implemented in a cost-effective and space-saving manner by means of such a device.

In this case, the test signal generator may be a PRBS test signal generator. A PRBS test signal generator can be used to apply a PRBS signal to the synchronous machine, which signal is simple to produce and, on the other hand, can be effectively distinguished from stochastic measured value noise or systematic interference, for example harmonics. The amplitude of such a PRBS test signal can also be selected to be relatively small.

In this case, the desired rotor angle can be advantageously set using the observer, that is to say a second-order filter. If correlation is detected as a result of the step of determining an error signal, the factors on which the function of the observer is based, in particular an acceleration and a frequency, are briefly changed as stated above in order to change the rotor angle.

In summary, embodiments of the present invention specifies a method and a device, with the aid of which a desired torque of a synchronous machine can be produced with an efficiency which is as optimal as possible. Since a position sensor is not required here, it is possible to save both costs of the sensor itself and installation space.

Since the method is independent of motor parameters and is not subject to any temperature dependence or component dependence, a full, optimum torque can be ensured at any time, in particular even at a standstill or in the case of low speeds, for example when a vehicle having a synchronous machine as the drive assembly approaches a mountain.

Furthermore, the method can be implemented without any additional hardware and with little software complexity using simple computation methods, in which case a coordinate system fixed with respect to the rotor or fixed with respect to the stator can be used.

Some embodiments provide a device for carrying out the method for sensorless control of a separately excited synchronous machine, the device comprising
a test signal generator for producing a test signal,
a measuring unit for measuring the characteristic variable of the electrical current driving the rotor on an axis of a coordinate system describing the synchronous machine,
a correlator for determining an error signal, and
an observer for adapting a desired rotor angle in response to the error signal.

In this case, the test signal generator is advantageously a signal generator for producing a PRBS signal.

Other embodiments provide a vehicle comprising the above-mentioned device.

FIG. 1 shows a flowchart of a method 1 for sensorless control of a separately excited synchronous machine according to one embodiment of the invention.

In this case, the method 1 has the following steps. A test signal M is first of all fed S1 into a characteristic variable of an electrical current driving the rotor. The characteristic variable of the electrical current driving the rotor is then measured S2 on an axis of the coordinate system describing the synchronous machine. An error signal is then determined S3, by means of correlation, from the measured characteristic variable of the electrical current driving the rotor and a temporally delayed test signal, and a desired rotor angle is in turn adapted in response thereto if the error signal has a value that is not equal to zero S4. In this case, the test signal M according to the exemplary embodiment in FIG. 1 is a PRBS signal.

In the exemplary embodiment in FIG. 1, the coordinate system describing the synchronous machine is a dq coordinate system which is a coordinate system fixed with respect to the rotor. Differential equation systems of a synchronous machine simulation which describe a two-axis model of the magnetic-linear, electrically excited synchronous machine and take into account all electrical and magnetic variables of a stator, a rotor and a damper are usually represented in a dq coordinate system for the sake of simplicity. In this case, a space vector of measured machine currents is broken down into two components which result from projection in the direction of the flux space vector (d axis) produced by a rotor coil and perpendicular thereto (q axis). Furthermore, however, the coordinate system describing the synchronous machine may also be an αβ coordinate system which is a coordinate system fixed with respect to the stator.

The characteristic variable of the current driving the rotor is a current in this case.

As can be seen, a q axis current component Iq is measured S2 as excitation, the dq coordinate system preferably being oriented in such a manner that the d axis points to the rotor.

In an embodiment which is not shown, however, the characteristic variable of the electrical current driving the rotor may also be a voltage.

In an embodiment which is not shown, however, the test signal may also be fed into a q axis of the dq coordinate system, for example into the q axis current component, and a d axis current component can be measured as excitation, or can be fed into the q axis voltage component and a rotor voltage can be measured as excitation, the dq coordinate system again preferably being oriented in such a manner that the d axis points to the rotor.

According to another embodiment of the method (not illustrated), an αβ coordinate system which is a coordinate system fixed with respect to the stator can also be used and the test signal can be fed into an α axis of the αβ coordinate system. For example, the test signal can again be fed into a current or a voltage, in which case an α component and a β component of the corresponding characteristic variable of the electrical current driving the rotor are measured as excitation.

An error signal is then determined by correlating the measured characteristic variable with a temporally delayed test signal S3, that is to say by relating the measured excitation to the temporally delayed test signal.

As shown in FIG. 1, this step S3 is carried out by continuously multiplying and integrating the measured excitation with the test signal m which has been temporally delayed by a time T, and the error signal ρ(T) is therefore represented by the equation $$\rho(T) = K \int_{-\infty}^{\infty} x(t)m(t+T)dt$$

where x(t) corresponds to the q axis current component at the time t, m corresponds to a PRBS signal delayed by the time T and K corresponds to a correlation coefficient.

If this integral or the error signal ρ(T) produces the value zero, there is coupling of the excitation to the q axis, that is to say the rotor position corresponds to the desired rotational angle, with the result that the method ends and can be restarted.

If a value that is not equal to zero results for the integral or the error signal ρ(T), correlation is thus detected, that is to say there is coupling of the excitation to the q axis in the exemplary embodiment in FIG. 1, which is synonymous with the fact that the coordinate system describing the synchronous machine 11 is not correctly oriented. In this case, the sign of the value of the integral or the error signal ρ(T) indicates the direction in which the correction needs to be made.

As illustrated, the rotational angle can then be adapted S4 by changing the rotor angle on the basis of integration from a frequency. Therefore, the equation $$\varphi = \int_{-\infty}^{\infty} f(t)dt$$

can be used to determine the desired rotor angle φ, where f(t) is the frequency at the time t. In this case, the frequency can in turn be produced by means of integration from an acceleration.

If a coordinate system fixed with respect to the stator is used for the description, the change in the rotor angle can be determined on the basis of the formation of an arc tangent from an α component and a β component of the measured characteristic variable of the electrical current driving the rotor.

In this case, the rotor angle φ can be advantageously adapted S4 using an observer (not shown in FIG. 1), that is to say a second-order filter. If correlation is detected as a result of the step of determining S3 an error signal ρ(T), the factors on which the function of the observer is based, in particular an acceleration and a frequency, are briefly changed as stated above in order to change the rotor angle. Finally, the method ends and can be restarted.

Figure 2:
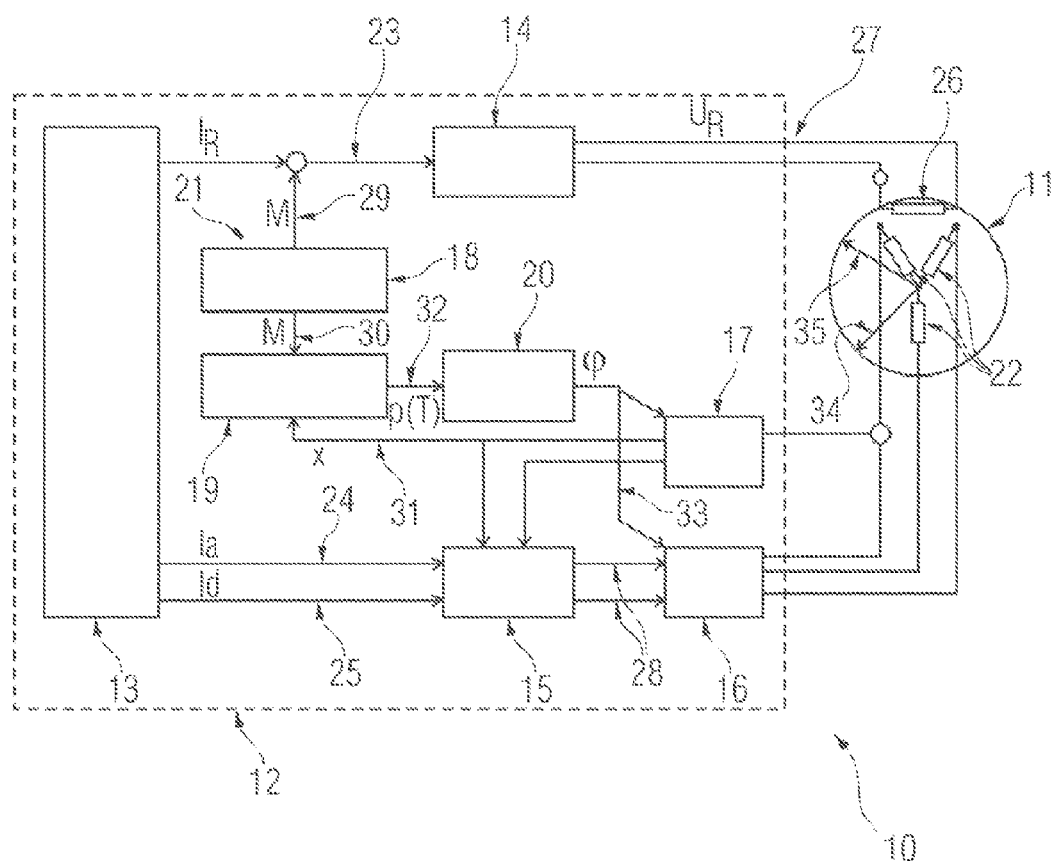
FIG. 2 shows a device according to one embodiment.

FIG. 2 shows a device 10 according to one embodiment of the invention.

A separately excited, inverter-controlled synchronous machine 11 and a motor controller for exciting the synchronous machine 11 can be seen in this case. In this case, the motor controller is symbolized by the dashed line provided with reference symbol 12 and comprises a desired current value forming device 13, an excitation current controller 14, a qd current controller 15 and transformers 16, 17 for current and voltage correction.

As also shown in FIG. 2, the device 10 additionally has a test signal generator 18 for producing a test signal M, a correlator 19 for producing an error signal ρ(T) and an observer 20 for adapting a rotor angle φ in response to the error signal ρ(T).

In the exemplary embodiment in FIG. 2, a dq coordinate system which is a coordinate system fixed with respect to the rotor is used to describe the synchronous machine 11. In this case, the axes of the dq coordinate system are indicated by the arrows symbolized with reference symbols 34 and 35. According to a second embodiment of the method (not illustrated), an αβ coordinate system which is a coordinate system fixed with respect to the stator can furthermore also be used.

The test signal generator 18 in FIG. 2 is a PRBS test signal generator 21.

As can be seen, the synchronous machine 11 illustrated has an excitation winding 26 and stator windings 22 which are fed with three-phase current. An excitation field is required in the rotor circuit so that the synchronous machine 11 can operate. A conventional control system is provided here for this purpose.

In this case, a desired value for an excitation current If is output to the excitation current controller 14 and desired values for a d axis current component Id and for a q axis current component Iq are output to the dq current controller via the desired current value forming device 13, which is symbolized by the arrows 23, 24, 25 provided with reference symbols.

The excitation current controller 14 is used to apply a controller output voltage Uf to the excitation winding 26, which is symbolized by the arrow 27. The qd current controller 15 is also coupled to the voltage correction transformer 16, which is symbolized by the arrows 28.

As also shown in FIG. 2, the test signal generator 18 is also used to feed a test signal M into the excitation current If, which is symbolized by the arrow 29. As symbolized by the arrow 30, the test signal generator 18 is also coupled to the correlator 19 which, as symbolized by the arrow 31, also receives values relating to a measured characteristic variable x of the electrical current driving the rotor from a measuring unit, that is to say relating to a q axis current component I from the current correction transformer 17 in the exemplary embodiment shown, and in turn determines an error signal ρ(T) by means of correlation from a test signal m which has been delayed by the time T and a measured characteristic variable. As symbolized by the arrow 32, the correlator 19 is in turn coupled to the observer 20 and forwards the error signal ρ(T) to the latter. The observer 20 in turn determines a rotor angle φ in response to the error signal ρ(T) and forwards the rotor angle, as symbolized by the arrow 33, to the current correction transformer 17 and to the voltage correction transformer 16 in order to be able to adjust the stator voltages and therefore a rotor position according to the desired rotor angle φ.

Although at least one exemplary embodiment was shown in the above description, different changes and modifications can be made. The embodiments mentioned are only examples and are not intended to restrict the scope, the applicability or the configuration in any way. Rather, the above description provides a person skilled in the art with a plan for implementing at least one exemplary embodiment, in which case numerous changes can be made to the function and the arrangement of elements described in an exemplary embodiment without departing from the scope of protection of the attached claims and their legal equivalents.

LIST OF REFERENCE SYMBOLS

1 Method
S1, S2, S3, S4 Method steps
10 Device
11 Synchronous machine
12 Motor controller
13 Desired current value forming device
14 Excitation current controller
15 q and d current controller
16 Voltage transformer
17 Current transformer
18 Test signal generator
19 Correlator
20 Observer
21 PRBS test signal generator
22 Stator windings
23, 24, 25 Couplings
26 Excitation winding
27, 28, 29, 30, 31, 32, 33 Couplings
34, 35 dq coordinate system
M Test signal
φ Desired rotor angle
ρ(T) Error signal
K Correlation coefficient
x Characteristic variable of an electrical current driving the rotor
m Test signal delayed by the time T
f Frequency
If Desired value for excitation current
Iq Desired value for q axis current component
Id Desired value for d axis current component
I q axis current component

What is claimed is:

1. A method for sensorless control of a separately excited synchronous machine having a rotor, the method comprising:
   feeding a test signal into a characteristic variable of an electrical current driving the rotor;
   measuring the characteristic variable of the electrical current driving the rotor on an axis of a coordinate system describing the synchronous machine;
   determining an error signal by correlating the measured characteristic variable of the electrical current driving the rotor with a temporally delayed test signal determined from the test signal that has been fed in; and
   adapting a rotor angle based on the determined error signal in response to determining that the error signal has a value that is not equal to zero.

2. The method of claim 1, wherein the test signal is a PRBS signal.

3. The method of claim 1, wherein the coordinate system describing the synchronous machine is a dq coordinate system which is fixed with respect to the rotor.

4. The method of claim 1, wherein the coordinate system describing the synchronous machine is an αβ coordinate system which is fixed with respect to the stator.

5. The method of claim 1, comprising determination of the error signal by continuously multiplying and integrating the measured characteristic variable of the electrical current driving the rotor with the test signal which has been temporally delayed by the time.

6. The method of claim 1, comprising adapting the rotor angle based on an integration from a frequency.

7. The method of claim 1, comprising adapting the rotor angle based on an arc tangent comprising an α component and a β component of the measured characteristic variable of the electrical current driving the rotor.

8. A device for providing a sensorless control of a separately excited synchronous machine having a rotor, the device comprising:
   a test signal generator for producing a test signal, which is fed into a characteristic variable of an electrical current driving the rotor,
   a measuring unit for measuring the characteristic variable of the electrical current driving the rotor on an axis of a coordinate system describing the synchronous machine,
   a correlator for determining an error signal by correlating the measured characteristic variable of the electrical current driving the rotor with a temporally delayed test signal determined from the test signal that has been fed in, and
   an observer for adapting a desired rotor angle based on the error signal in response to determining that the error signal has a value that is not equal to zero.

9. The device of claim 8, wherein the test signal generator is a signal generator for generating a PRBS signal.

10. The device of claim 8, wherein the coordinate system describing the synchronous machine is a dq coordinate system which is fixed with respect to the rotor.

11. The device of claim 8, wherein the coordinate system describing the synchronous machine is an αβ coordinate system which is fixed with respect to the stator.

12. The device of claim 8, wherein the correlator is configured to determine the error signal by continuously multiplying and integrating the measured characteristic variable of the electrical current driving the rotor with the test signal which has been temporally delayed by the time.

13. The device of claim 8, wherein the observer is configured to adapt the rotor angle based on an integration from a frequency.

14. The device of claim 8, wherein the observer is configured to adapt the rotor angle based on an arc tangent comprising an α component and a β component of the measured characteristic variable of the electrical current driving the rotor.

15. A vehicle comprising:
- a synchronous machine having a rotor; and
- a device for providing a sensorless control of the synchronous machine, the device comprising:
- a test signal generator for producing a test signal, which is fed into a characteristic variable of an electrical current driving the rotor,
- a measuring unit for measuring the characteristic variable of the electrical current driving the rotor on an axis of a coordinate system describing the synchronous machine,
- a correlator for determining an error signal by correlating the measured characteristic variable of the electrical current driving the rotor with a temporally delayed test signal determined from the test signal that has been fed in, and
- an observer for adapting a desired rotor angle based on the error signal in response to determining that the error signal has a value that is not equal to zero.

* * * * *